(12) United States Patent
Schmitt

(10) Patent No.: US 11,212,939 B2
(45) Date of Patent: Dec. 28, 2021

(54) BOARD LEVEL SHIELD FOR ELECTRICAL ASSEMBLY

(71) Applicant: TE Connectivity Services GmbH, Schaffhausen (CH)

(72) Inventor: Matthew Ryan Schmitt, Middletown, PA (US)

(73) Assignee: TE CONNECTIVITY SERVICES GmbH, Schaffhausen (CH)

( * ) Notice: Subject to any disclaimer, the term of this patent is extended or adjusted under 35 U.S.C. 154(b) by 81 days.

(21) Appl. No.: 16/833,796

(22) Filed: Mar. 30, 2020

(65) Prior Publication Data
US 2021/0307205 A1   Sep. 30, 2021

(51) Int. Cl.
*H01L 23/552* (2006.01)
*H05K 9/00* (2006.01)
*H05K 7/20* (2006.01)

(52) U.S. Cl.
CPC ....... *H05K 7/20445* (2013.01); *H01L 23/552* (2013.01); *H05K 9/0026* (2013.01); *H01L 2924/3025* (2013.01)

(58) Field of Classification Search
CPC ................... H05K 9/0026; H01L 23/552
See application file for complete search history.

(56) References Cited

U.S. PATENT DOCUMENTS 9,439,333 B2 * 9/2016 Daughtry, Jr. ..... H05K 7/20418
10,757,846 B2 * 8/2020 Lee ....................... H05K 9/0032

* cited by examiner

*Primary Examiner* — Hung V Ngo

(57) ABSTRACT

A board level shield includes shield walls forming a shield chamber sized and shaped to receive an electrical component mounted to a host circuit board. The shield walls provide electrical shielding entirely around the shield chamber for the electrical component. The shield walls extend between a top and a bottom configured to be mounted to the host circuit board and connected to a ground layer of the host circuit board. The board level shield includes a shield opening at the top bounded by the shield walls and sized and shaped to receive a thermal bridge to allow the thermal bridge to extend through the shield opening to interface with the electrical component. The board level shield includes shield fingers extending from the shield walls into the shield opening. The shield fingers are configured to engage the thermal bridge at separable mating interfaces to electrically connect the shield fingers to the thermal bridge.

20 Claims, 5 Drawing Sheets

BOARD LEVEL SHIELD FOR ELECTRICAL ASSEMBLY

BACKGROUND OF THE INVENTION

The subject matter herein relates generally to shielding for electrical components.

Communication systems include electrical components, such as processors, antennas, integrated circuits, ASICs, and the like. The electrical components perform operations or processes within the communication system. Typically, the electrical components are mounted to a circuit board. During operation, the electrical components generate electromagnetic radiation, which may degrade performance of other electrical components within the system. Additionally, electromagnetic radiation from other electrical components may degrade performance of the electrical component. Some known communication systems use shields to provide electrical shielding for the electrical components to reduce effects of electromagnetic interference (EMI) from the electromagnetic radiation. However, as the electrical components tend to generate heat. As data communication speeds increase, the electrical components generate greater amount of heat. Some shields include openings to allow airflow through the shields. However, such airflow is insufficient for heat dissipation of some electrical components in some known communication systems.

Accordingly, there is a need for a communication system providing electrical shielding and heat dissipation for electrical components.

BRIEF DESCRIPTION OF THE INVENTION

In one embodiment, a board level shield for an electrical assembly is provided. The board level shield comprises shield walls forming a shield chamber. The shield chamber is sized and shaped to receive an electrical component mounted to a host circuit board. The shield walls provide electrical shielding entirely around the shield chamber for the electrical component. The shield walls extend between a top and a bottom. The bottom is configured to be mounted to the host circuit board and is electrically connected to a ground layer of the host circuit board. The board level shield includes a shield opening at the top. The shield opening is open to the shield chamber. The shield opening is bounded by the shield walls. The shield opening is sized and shaped to receive a thermal bridge to allow the thermal bridge to extend through the shield opening to interface with the electrical component. The board level shield includes shield fingers extending from the shield walls into the shield opening. The shield fingers are configured to engage the thermal bridge at separable mating interfaces to electrically connect the shield fingers to the thermal bridge.

In another embodiment, an electrical assembly is provided. The electrical assembly includes a thermal bridge having an upper surface and a lower surface. The lower surface has a lower thermal interface configured to be thermally coupled to an electrical component to dissipate heat from the electrical component. The electrical assembly includes a board level shield configured to shield the electrical component. The board level shield includes shield walls forming a shield chamber that is sized and shaped to receive the electrical component. The shield walls provide electrical shielding entirely around the shield chamber for the electrical component. The shield walls extend between a top and a bottom. The bottom is configured to be mounted to a host circuit board and is electrically connected to a ground layer of the host circuit board. The board level shield includes a shield opening at the top. The shield opening is bounded by the shield walls and is sized and shaped to receive the thermal bridge. The board level shield includes shield fingers extending from the shield walls into the shield opening to engage the thermal bridge at separable mating interfaces to electrically connect the shield fingers to the thermal bridge.

In a further embodiment, an electrical assembly is provided. The electrical assembly includes an electrical component mounted to a host circuit board. The electrical component includes a component interface at a top of the electrical component. The electrical assembly includes a board level shield mounted to the host circuit board. The board level shield includes shield walls forming a shield chamber that is sized and shaped to receive the electrical component. The shield walls provide electrical shielding entirely around the electrical component. The shield walls extend between a top and a bottom. The bottom is mounted to the host circuit board and is electrically connected to a ground layer of the host circuit board. The board level shield includes a shield opening at the top. The shield opening is bounded by the shield walls. The board level shield includes shield fingers extending from the shield walls into the shield opening. The electrical assembly includes a thermal bridge received in the shield opening. The thermal bridge has bridge walls extending between an upper surface and a lower surface. The upper surface is located exterior of the shield chamber and the lower surface is located interior of the shield chamber. The lower surface has a lower thermal interface thermally coupled to the component interface of the electrical component to dissipate heat from the electrical component. The shield fingers engage the bridge walls of the thermal bridge at separable mating interfaces to electrically connect the shield fingers to the thermal bridge.

DETAILED DESCRIPTION OF THE INVENTION

Figure 1:
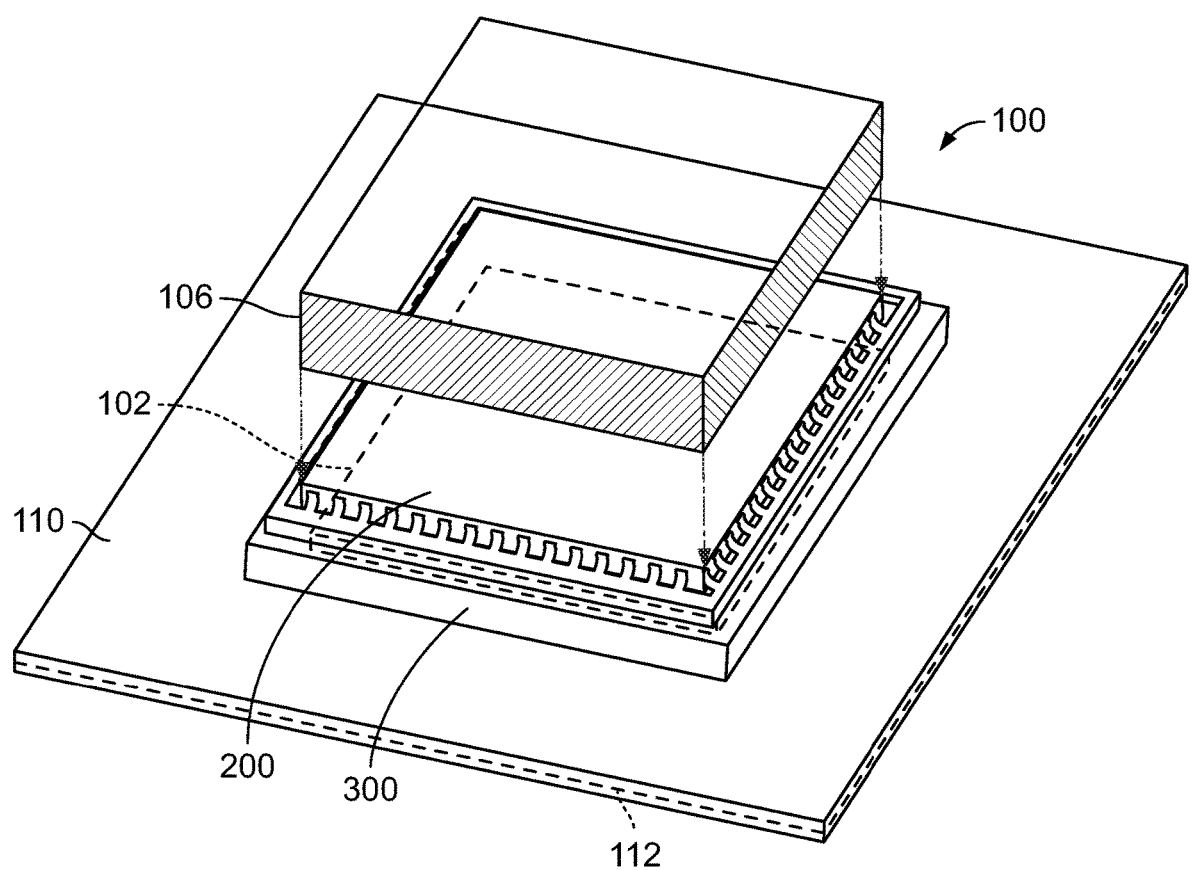
FIG. 1 is a front perspective view of a communication system in accordance with an exemplary embodiment.

FIG. 1 is a front perspective view of a communication system 100 in accordance with an exemplary embodiment. The communication system 100 includes at least one electrical component 102 (shown in phantom) mounted to a host circuit board 110. The communication system 100 includes a thermal bridge 200 configured to be thermally coupled to the electrical component 102 for dissipating heat from the electrical component 102. The communication system 100 includes a board level shield 300 coupled to the host circuit board 110 for shielding the electrical component 102. The board level shield 300 is coupled to the thermal bridge 200 at a shield interface to provide electrical shielding around the entire perimeter of the thermal bridge 200.

In an exemplary embodiment, the communication system 100 includes a heat transfer device 106 for dissipating heat from the thermal bridge 200. The thermal bridge 200 forms a thermal interface between the electrical component 102 and the heat transfer device 106. The heat transfer device 106 may be a heat sink, such as a finned heat sink, configured to be air cooled by transferring heat to the passing airflow. In other various embodiments, the heat transfer device 106 may be a heat spreader, a cold plate having liquid cooling, and the like.

In an exemplary embodiment, the thermal bridge 200 is compressible between the electrical component 102 and the heat transfer device 106. For example, the lower thermal interface of the thermal bridge 200 may be conformable to a shape of the electrical component 102 and/or an upper thermal interface of the thermal bridge 200 may be conformable to a shape of the heat transfer device 106 for efficient thermal transfer therebetween.

In an exemplary embodiment, the electrical component 102 is mounted to the host circuit board 110. For example, the electrical component 102 may be surface mounted to solder pads on the upper surface of the host circuit board 110. In other various embodiments, the electrical component 102 may be press-fit to plated vias of the host circuit board 110 or connected by other processes. In an exemplary embodiment, the host circuit board 110 includes a ground plane 112. The board level shield 300 is mounted to the host circuit board 110 to surround the electrical component 102. The board level shield 300 is electrically connected to the ground plane 112. The ground plane 112 provides electrical shielding below the electrical component 102, the board level shield 300 provides electrical shielding around the sides of the electrical component 102, and the thermal bridge 200 provides electrical shielding over the top of the electrical component 102. As such, the electrical component 102 is completely shielded.

In various embodiments, the electrical component 102 may be an electronic package, such as a processor, a memory module, an integrated circuit, and the like. The electronic package may be directly mounted to the host circuit board 110. Alternatively, an interposer or socket connector may be provided between the electronic package and the host circuit board 110. The board level shield 300 may surround the socket connector in addition to the electrical component 102 to provide electrical shielding for such component. In other various embodiments, other types of electrical components 102 may be provided. In various embodiments, multiple electrical components 102 may be provided in the mounting area surrounded by the board level shield 300.

Figure 2:
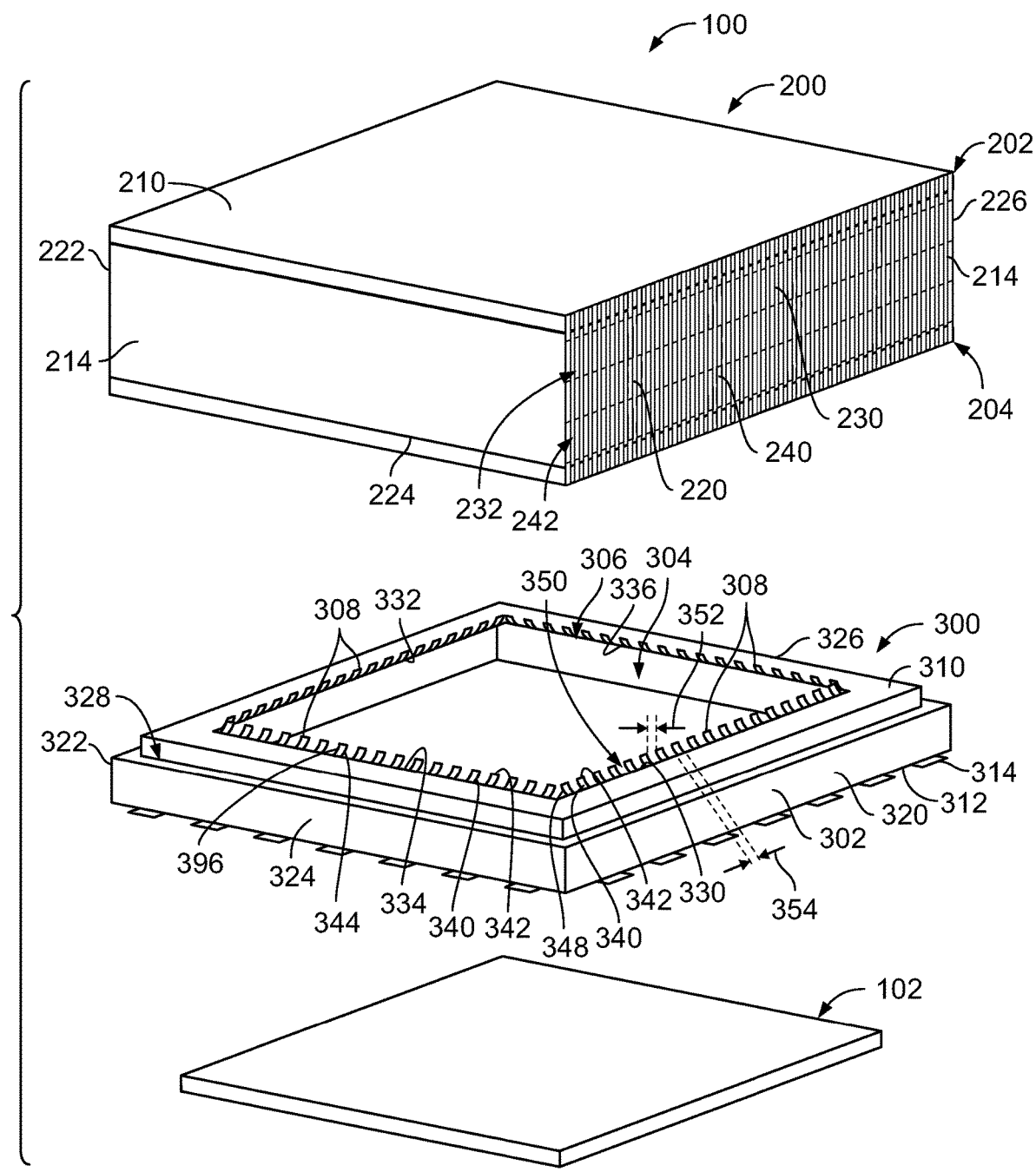
FIG. 2 is an exploded view of the communication system showing the thermal bridge and the board level shield in accordance with an exemplary embodiment.

FIG. 2 is an exploded view of the communication system 100 showing the thermal bridge 200 and the board level shield 300 in accordance with an exemplary embodiment. The thermal bridge 200 is configured to be loaded into the board level shield 300 to interface with the electrical component 102. The board level shield 300 is configured to be electrically connected to the thermal bridge 200 around the periphery of the thermal bridge 200 to provide 360° shielding around the thermal bridge 200.

In an exemplary embodiment, the thermal bridge 200 includes an upper bridge assembly 202 and a lower bridge assembly 204. A spring element (not shown) may be provided between the upper and lower bridge assemblies 202, 204 to spread the upper bridge assembly 202 apart from the lower bridge assembly 204. In various embodiments, the upper and lower bridge assemblies 202, 204 are compressible relative to each other. For example, the upper and lower bridge assemblies 202, 204 are compressible between the electrical component 102 and the heat transfer device 106. A bridge frame (not shown) may be provided for holding the upper and lower bridge assemblies 202, 204 together. The bridge frame may extend internally within the interior of the thermal bridge 200 to hold the upper and lower bridge assemblies 202, 204. In other various embodiments, the bridge frame may be provided around the exterior of the thermal bridge 200.

In various embodiments, the upper and lower bridge assemblies 202, 204 include a plurality of interleaved plates that are thermally coupled together to form the thermal bridge 200. In an exemplary embodiment, the lower bridge assembly 204 is configured to thermally engage the electrical component 102 and the upper bridge assembly 202 is configured to dissipate heat into the external environment and/or to the heat transfer device 106. The upper bridge assembly 202 is in thermal communication with the lower bridge assembly 204 and dissipates heat away from the lower bridge assembly 204 to cool the electrical component 102.

In an exemplary embodiment, the thermal bridge 200 is parallelepiped (for example, generally box shaped). For example, the thermal bridge 200 includes a top 210, a bottom 212, and bridge walls 214 extending between the top 210 and the bottom 212. For example, the bridge walls 214 include a front wall 220, a rear wall 222, a first side wall 224, and a second side wall 226. The top 210 may be generally planar. The bottom 212 may be generally planar. The front wall 220 may be generally planar. The rear wall 222 may be generally planar. The first side wall 224 may be generally planar. The second side wall 226 may be generally planar. However, the thermal bridge 200 may have other shapes in alternative embodiments. The outer surfaces of the thermal bridge 200 (for example, front wall 220, rear wall 222, first side wall 224, and second side wall 226) define a periphery of the thermal bridge 200 and are each exposed and accessible for connection with the board level shield 300.

In an exemplary embodiment, the bridge assemblies 202, 204 each include a plurality of plates that are arranged together in plate stacks. For example, the upper bridge assembly 202 includes a plurality of upper plates 230 arranged in an upper plate stack 232 and the lower bridge assembly 204 includes a plurality of lower plates 240 arranged in a lower plate stack 242. One or more spring element(s) (not shown) may be located between the upper and lower plates 230, 240. The plates 230, 240 are interleaved with each other for thermal communication between the upper bridge assembly 202 and the lower bridge assembly 204. The individual plates 230, 240 are movable relative to each other such that the plates 230, 240 may be individually articulated to conform to the electrical component 102 and/or the heat transfer device 106. For example, the lower plates 240 may conform to the electrical component 102 at the lower thermal interface for improved contact and/or proximity between the thermal bridge 200 and the electrical component 102 and/or the upper plates 230 may conform to the heat transfer device 106 at the upper thermal interface for improved contact and/or proximity between the thermal bridge 200 and the heat transfer device 106. Gaps or spaces may be provided between the upper and lower plates 230, 240 of the bridge assemblies 202, 204 to allow compressive movement of the spring element 206 between the bridge assemblies 202, 204.

The board level shield 300 includes shield walls 302 forming a shield chamber 304. The shield walls 302 provide electrical shielding entirely around the shield chamber 304 for the electrical component 102. The board level shield 300 includes a shield opening 306, which is open to the shield chamber 304. The shield chamber 304 receives the thermal bridge 200 through the shield opening 306 to interface with the electrical component 102. The shield chamber 304 is sized and shaped to receive the electrical component 102. The shield chamber 304 surrounds the electrical component 102 to provide electrical shielding for the electrical component 102. In an exemplary embodiment, the thermal bridge 200 is manufactured from an electrically conductive material, such as a metal material, such that the thermal bridge 200 provides electrical shielding for the electrical component 102 from above. The thermal bridge 200 cooperates with the board level shield 300 to provide electrical shielding for the electrical component 102. The shield walls 302 are configured to be electrically connected to each of the bridge walls 214 of the thermal bridge 200. For example, the board level shield 300 includes shield fingers 308 extending from each of the shield walls 302 to interface with the thermal bridge 200.

The board level shield 300 extends between a top 310 and a bottom 312. The shield walls 302 extend between the top 310 and the bottom 312. The top 310 may provide electrical shielding for the electrical component 102 from above, such as between the shield walls 302 and the thermal bridge 200. The shield opening 306 is located at the top 310. The shield fingers 308 extend from the top 310 into the shield opening 306 to interface with the thermal bridge 200. The bottom 312 is configured to be mounted to the host circuit board 110 (shown in FIG. 1). For example, the board level shield 300 may be electrically connected to the ground plane 112 of the host circuit board 110. In an exemplary embodiment, the board level shield 300 includes tabs 314 extending from the bottom 312 configured to be terminated to the host circuit board 110. The tabs 314 may be solder tabs configured to be soldered to the host circuit board 110. Other types of tabs may be provided, such as press fit tabs.

The board level shield 300 includes a first end shield wall 320 and a second end shield wall 322 opposite the first end shield wall 320. The first end shield wall 320 may be provided at a front of the board level shield 300 and the second end shield wall 322 may be provided at a rear of the board level shield 300. The board level shield 300 includes a first side shield wall 324 and a second side shield wall 326 opposite the first side shield wall 324. The first and second side shield walls 324, 326 may extend between the end shield walls 320, 322. For example, the first and second side shield walls 324, 326 may meet the first and second end shield walls 320, 322 at corners of the board level shield 300. The board level shield 300 may include greater or fewer shield walls 302 in alternative embodiments. In various embodiments, the shield walls 302 may be planar. In alternative embodiments, as in the illustrated embodiment, the shield walls 302 may be non-planar. For example, the shield walls 302 may include ledges 328 between the top 310 and the bottom 312. The ledges 328 may extend inward such that the board level shield 300 has a larger footprint at the bottom 312.

In an exemplary embodiment, the shield opening 306 is defined by opening edges surrounding the shield opening 306. For example, the first end shield wall 320 includes a first end edge 330 and the second end shield wall 322 includes a second end edge 332 opposite the first end edge 330. The first side shield wall 324 includes a first side edge 334 and the second side shield wall 326 includes a second side edge 336 opposite the first side edge 334. A perimeter of the shield opening 306 is rectangular in the illustrated embodiment. The perimeter of the shield opening 306 may have other shapes in alternative embodiments, such as a complementary shape to the thermal bridge 200. The shape of the shield opening 306 may be irregular in alternative embodiments. The perimeter of the shield opening 306 may be a circular shape or an oval shape. The corners of the shield opening 306 may be curved or rounded.

The shield fingers 308 extend from the shield walls 302 into the shield opening 306. In an exemplary embodiment, the shield fingers 308 entirely surround the perimeter of the shield opening 306 (for example, are arranged on all four sides of the shield opening 306). Each shield finger 308 extends from a base 340 to a tip 342. The shield fingers 308 have first and second edges 344, 346 between the base 340 and the tip 342. The edges 344, 346 may be parallel to each other in various embodiments. In other embodiments, the edges 344, 346 may be non-parallel, such as being tapered from the base 340 to the tip 342 (for example, wider at the base 340 and narrower at the tip 342).

Each shield finger 308 is cantilevered from the base 340 to the tip 342. For example, the base 340 is a fixed end of the shield finger 308 and the tip 342 is a free end of the shield finger 308. In the illustrated embodiment, the shield finger 308 is curved between the base 340 and the tip 342. For example, the shield finger 308 may extend generally horizontally at the base 340 and may extend generally vertically at the tip 342. The shield finger 308 may have a continuous, smooth curve from the base 340 to the tip 342. The tip 342 may be curved outward to form a curved lead-in to the shield opening 306 for the thermal bridge. The curved tip 342 prevents stubbing or damage to the shield fingers 308 when the thermal bridge 200 is loaded into the shield opening 306.

The shield finger 308 has a separable mating interface 348 at or near the tip 342. The separable mating interface 348 is configured to engage the thermal bridge 200 to electrically connect the board level shield 300 to the thermal bridge 200. In an exemplary embodiment, the shield fingers 308 are deflectable and configured to be spring biased against the thermal bridge 200. The shield fingers 308 may be used to position or center the thermal bridge 200 in the shield opening 306.

In an exemplary embodiment, the shield fingers 308 extend from each of the shield walls 302. For example, the shield fingers 308 extend from the first and second end shield walls 320, 322 and from the first and second side shield walls 324, 326. The shield fingers 308 extending from the first end shield wall 320 are configured to engage the front wall 220 of the thermal bridge 200. The shield fingers 308 extending from the second end shield wall 322 are configured to engage the rear wall 222 of the thermal bridge 200. The shield fingers 308 extending from the first and second end shield walls 320, 322 impart opposing spring forces against the thermal bridge 200 to position the thermal bridge 200 between the first and second end edges 330, 332. The shield fingers 308 extending from the first side shield wall 324 are configured to engage the first side wall 224 of the thermal bridge 200. The shield fingers 308 extending from the second side shield wall 326 are configured to engage the second side wall 226 of the thermal bridge 200. The shield fingers 308 extending from the first and second side shield walls 324, 326 impart opposing spring forces against the thermal bridge 200 to position the thermal bridge 200 between the first and second side edges 334, 336.

In an exemplary embodiment, the shield fingers 308 are separated from each other by shield gaps 350. For example, the shield fingers 308 are separate from each other and independently movable relative to each other for engaging the thermal bridge 200. The shield gaps 350 have gap widths 352 that are sufficiently narrow to block EMI leakage through the shield opening 306 between the shield walls 302 and the bridge walls 214 of the thermal bridge 200 in a target frequency range. For example, the gap widths 352 may be reduced or narrowed to block a greater frequency range (for example, to block higher frequencies). The gap widths 352 may be dependent on the width of the opening edge, the number of shield fingers 308 and finger widths 354 of the shield fingers 308. Optionally, the gap widths 352 may be less than the finger widths 354. Alternatively, the gap widths 352 may be equal to the finger widths 354 or the gap widths 352 may be greater than the finger widths 354. The gap widths 352 may be variable in various embodiments, such as when the shield fingers 308 are tapered.

Figure 3:
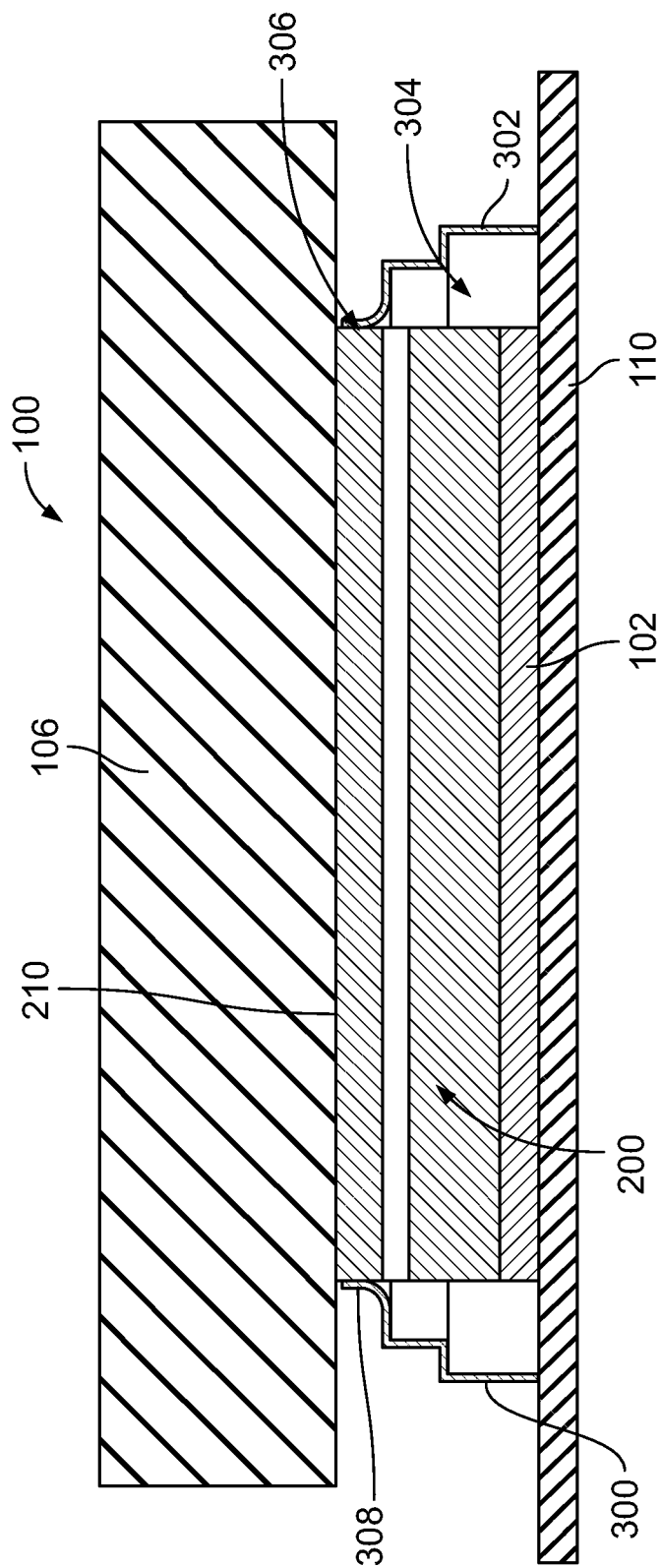
FIG. 3 is a cross-sectional view of the communication system showing the thermal bridge and the board level shield in accordance with an exemplary embodiment.

FIG. 3 is a cross-sectional view of the communication system 100 showing the thermal bridge 200 and the board level shield 300 in accordance with an exemplary embodiment. The board level shield 300 is configured to be mounted to the host circuit board 110 over the electrical component 102 to provide shielding for the electrical component 102. For example, the shield walls 302 may be soldered to the host circuit board 110 to electrically connect the board level shield 300 to the ground plane 112. The rear shield wall is illustrated in FIG. 3 in the background behind the electrical component with the side shield walls in cross-section. The shield chamber 304 is sized to surround the electrical component 102. In various embodiments, the board level shield 300 is oversized relative to the electrical component 102 such that gaps or spacing is provided between the shield walls 302 and the sides of the electrical component 102, such as for routing of traces on the host circuit board 110. The gap may be an air gap between the shield walls 302 and the electrical component 102. Alternatively, the gap may be filled with material, such as shielding material and/or thermally conductive material.

During assembly, after the board level shield 300 is coupled to the host circuit board 110, the thermal bridge 200 is configured to be loaded through the shield opening 306 into the shield chamber 304. The shield opening 306 is aligned with the electrical component 102 (for example, above the electrical component 102). The thermal bridge 200 may be loaded downward through the shield opening 306 into the shield chamber 304 to engage the upper surface of the electrical component 102. The shield fingers 308 may be used to center or position the thermal bridge 200 relative to the board level shield 300 and the electrical component 102. The shield fingers 308 are deflectable to engage and maintain physical contact with the thermal bridge 200. For example, the shield fingers 308 may be elastically deformed by the thermal bridge 200 when the thermal bridge 200 is loaded into the shield chamber 304.

During assembly, after the thermal bridge 200 is loaded into the board level shield 300, the heat transfer device 106 is coupled to the top 210 of the thermal bridge 200. The heat transfer device 106 may press downward against the thermal bridge 200 to compress the thermal bridge 200. The heat transfer device 106 may hold the thermal bridge 200 downward against the electrical component 102.

Figure 4:
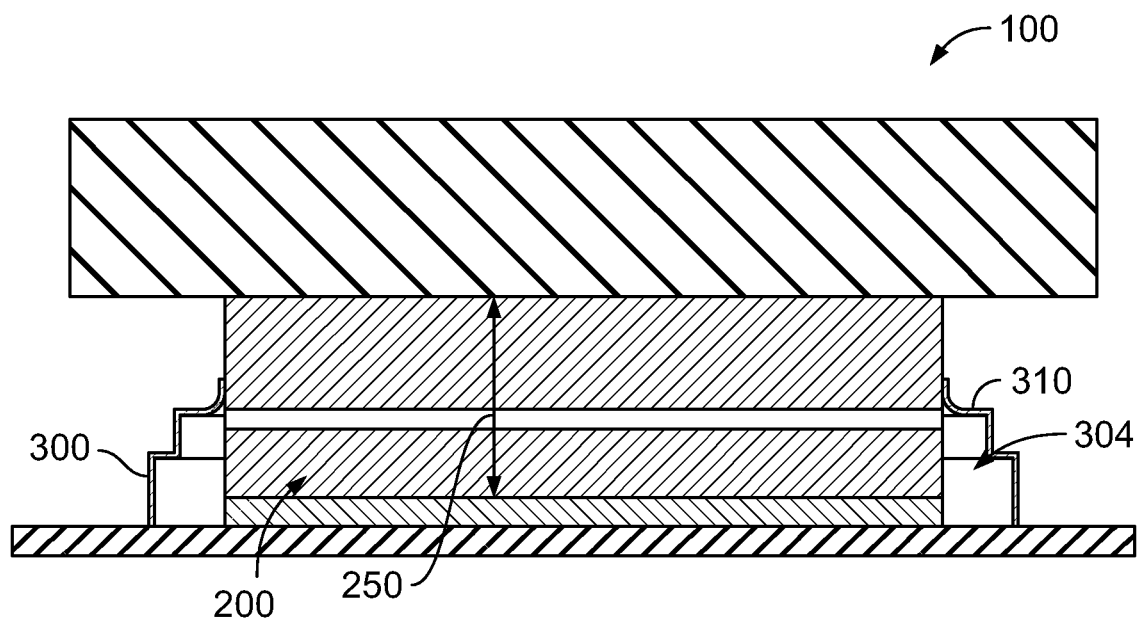
FIG. 4 is a cross-sectional view of the communication system showing the thermal bridge and the board level shield in accordance with an exemplary embodiment.

FIG. 4 is a cross-sectional view of the communication system 100 showing the thermal bridge 200 and the board level shield 300 in accordance with an exemplary embodiment. In the illustrated embodiment, the thermal bridge 200 has a height 250, which is taller than the height of the thermal bridge shown in FIG. 3. The board level shield 300 is configured to interface with different height thermal bridges. A portion of the thermal bridge 200 is located above the top 310 of the board level shield 300 and a portion of the thermal bridge 200 is located below the top 310 in the shield chamber 304.

Figure 5:
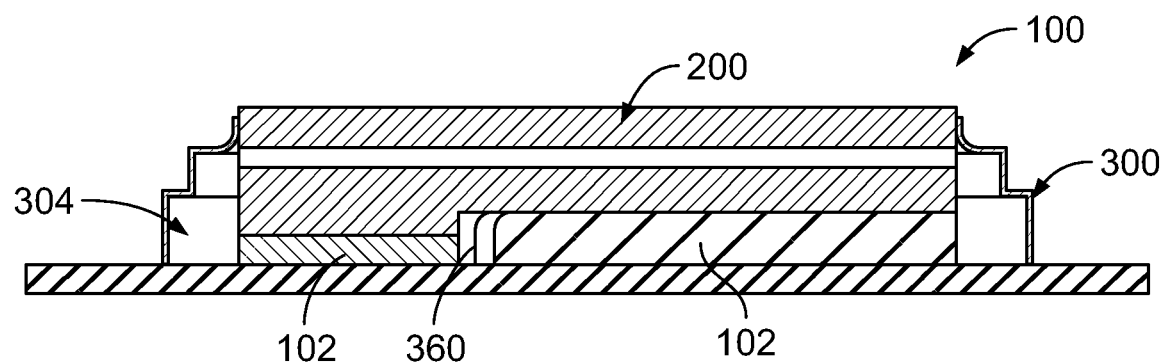
FIG. 5 is a cross-sectional view of the communication system showing the thermal bridge and the board level shield in accordance with an exemplary embodiment.

FIG. 5 is a cross-sectional view of the communication system 100 showing the thermal bridge 200 and the board level shield 300 in accordance with an exemplary embodiment. In the illustrated embodiment, the communication system 100 includes a plurality of electrical components 102 within the shield chamber 304 of the board level shield 300. The thermal bridge 200 is configured to interface with the plurality of electrical components 102. Optionally, the board level shield 300 may include a separating wall 360 between the electrical components 102 to provide electrical shielding between the electrical components 102.

Figure 6:
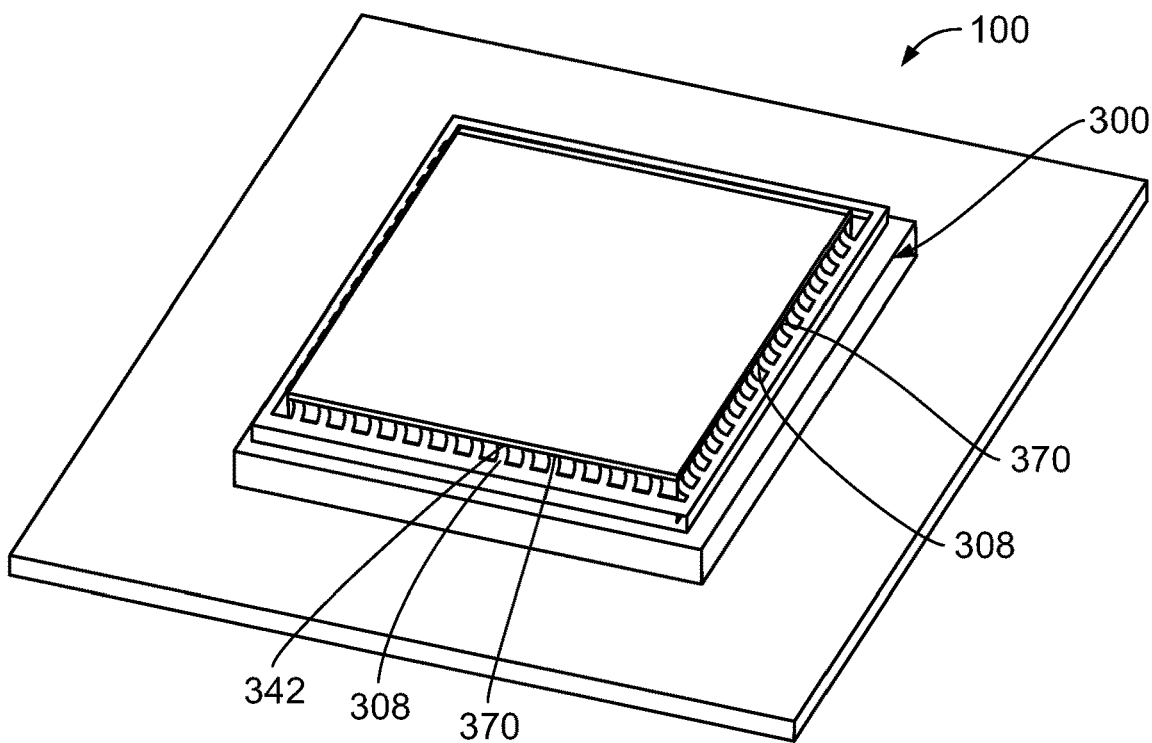
FIG. 6 is a top perspective view of the communication system showing the board level shield in accordance with an exemplary embodiment.

FIG. 6 is a top perspective view of the communication system 100 showing the board level shield 300 in accordance with an exemplary embodiment. In the illustrated embodiment, the board level shield 300 includes tie bars 370 between the shield fingers 308. The tie bars 370 are located at or near the tips 342 of the shield fingers 308. The tie bars 370 mechanically and electrically connect the shield fingers 308.

Figure 7:
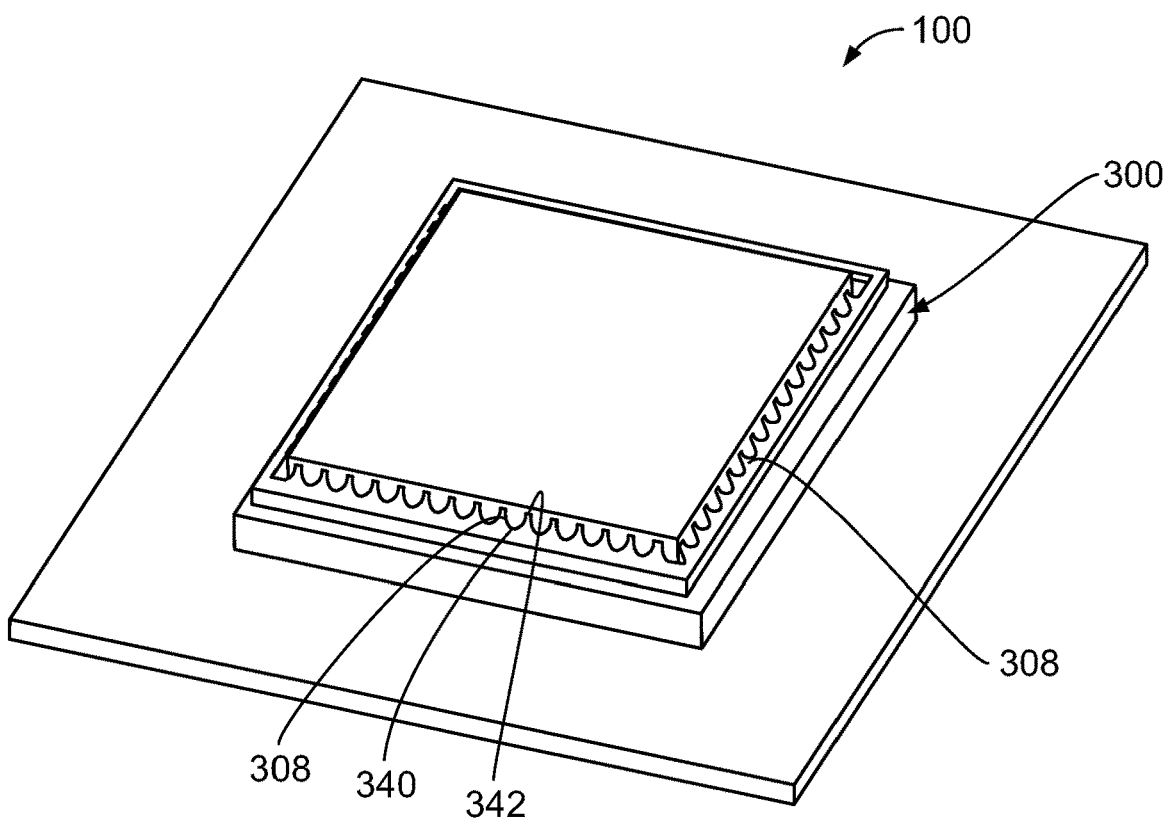
FIG. 7 is a top perspective view of the communication system showing the board level shield in accordance with an exemplary embodiment.

FIG. 7 is a top perspective view of the communication system 100 showing the board level shield 300 in accordance with an exemplary embodiment. In the illustrated embodiment, the shield fingers 308 of the board level shield 300 are tapered. The shield fingers 308 are narrower at the tips 342 and wider at the bases 340. The narrower tips 342 allow the shield fingers 308 to be more flexible compared to wider shield fingers 308. The wider bases 340 reduce the gaps between the shield fingers 308 for improved EMI shielding compared to shield fingers 308 having narrower bases.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A board level shield for an electrical assembly comprising:
   shield walls forming a shield chamber, the shield chamber sized and shaped to receive an electrical component mounted to a host circuit board, the shield walls providing electrical shielding entirely around the shield chamber for the electrical component, the shield walls extending between a top and a bottom, the bottom configured to be mounted to the host circuit board and being electrically connected to a ground layer of the host circuit board;
   a shield opening at the top, the shield opening being open to the shield chamber, the shield opening being bounded by the shield walls, the shield opening being sized and shaped to receive a thermal bridge to allow the thermal bridge to extend through the shield opening to interface with the electrical component; and
   shield fingers extending from the shield walls into the shield opening, the shield fingers configured to engage the thermal bridge at separable mating interfaces to electrically connect the shield fingers to the thermal bridge.

2. The board level shield of claim 1, wherein the shield fingers are deflectable and configured to be spring biased against the thermal bridge.

3. The board level shield of claim 1, wherein the shield fingers are separated from each other by shield gaps, widths of the shield gaps being narrow enough to block EMI leakage through the shield opening between the shield walls and the thermal bridge in a target frequency range.

4. The board level shield of claim 1, wherein the shield fingers have finger widths, the shield fingers being separated from each other by shield gaps, the shield gaps having gap widths less than the finger widths.

5. The board level shield of claim 1, wherein the shield fingers entirely surround a perimeter of the shield opening.

6. The board level shield of claim 1, wherein the shield walls include a first side shield wall, a second side shield wall, a first end shield wall and a second end shield wall, the shield opening being defined by a first side edge of the first side shield wall, a second side edge of the second side shield wall, a first end edge of the first end wall, and a second end edge of the second end wall, wherein the shield fingers extend from the first and second side edges and extend from the first and second end edges.

7. The board level shield of claim 6, wherein the shield fingers extending from the first and second side edges impart opposing spring forces against the thermal bridge to position the thermal bridge between the first and second side edges, and wherein the shield fingers extending from the first and second end edges impart opposing spring forces against the thermal bridge to position the thermal bridge between the first and second end edges.

8. The board level shield of claim 1, further comprising shield tie bars extending between corresponding shield fingers to mechanically and electrically connect the corresponding shield fingers.

9. The board level shield of claim 1, wherein each shield finger extends between a base and a tip, the separable mating interface provided proximate to the tip, the base being wider than the tip.

10. An electrical assembly comprising:
    a thermal bridge having an upper surface and a lower surface, the lower surface having a lower thermal interface configured to be thermally coupled to an electrical component to dissipate heat from the electrical component; and
    a board level shield configured to shield the electrical component, the board level shield including shield walls forming a shield chamber sized and shaped to receive the electrical component, the shield walls providing electrical shielding entirely around the shield chamber for the electrical component, the shield walls extending between a top and a bottom, the bottom configured to be mounted to a host circuit board and being electrically connected to a ground layer of the host circuit board, the board level shield including a shield opening at the top, the shield opening being bounded by the shield walls and sized and shaped to receive the thermal bridge, the board level shield including shield fingers extending from the shield walls into the shield opening to engage the thermal bridge at separable mating interfaces to electrically connect the shield fingers to the thermal bridge.

11. The electrical assembly of claim 10, wherein the shield fingers are deflectable such that the shield fingers are spring biased against the thermal bridge.

12. The electrical assembly of claim 10, wherein the shield fingers are separated from each other by shield gaps, widths of the shield gaps being narrow enough to block EMI leakage through the shield opening between the shield walls and the thermal bridge in a target frequency range.

13. The electrical assembly of claim 10, wherein the shield fingers have finger widths, the shield fingers being separated from each other by shield gaps, the shield gaps having gap widths less than the finger widths.

14. The electrical assembly of claim 10, wherein the shield fingers entirely surround a perimeter of the shield opening.

15. The electrical assembly of claim 10, wherein the shield walls include a first side shield wall, a second side shield wall, a first end shield wall and a second end shield wall, the shield opening being defined by a first side edge of the first side shield wall, a second side edge of the second side shield wall, a first end edge of the first end wall, and a second end edge of the second end wall, wherein the shield fingers extend from the first and second side edges and extend from the first and second end edges.

16. The electrical assembly of claim 15, wherein the shield fingers extending from the first and second side edges impart opposing spring forces against the thermal bridge to position the thermal bridge between the first and second side edges, and wherein the shield fingers extending from the first and second end edges impart opposing spring forces against the thermal bridge to position the thermal bridge between the first and second end edges.

17. The electrical assembly of claim 10, wherein the thermal bridge includes an upper thermal interface at the upper surface configured to interface with a heat transfer device to dissipate heat from the electrical component to the heat transfer device.

18. The electrical assembly of claim 10, wherein the thermal bridge includes a plurality of plates arranged in a plate stack, the plates being independently moveable relative to each other, sides of the plates facing each other in thermal communication with adjacent plates.

19. An electrical assembly comprising:

an electrical component mounted to a host circuit board, the electrical component including a component interface at a top of the electrical component;

a board level shield mounted to the host circuit board, the board level shield including shield walls forming a shield chamber sized and shaped to receive the electrical component, the shield walls providing electrical shielding entirely around the electrical component, the shield walls extending between a top and a bottom, the bottom mounted to the host circuit board and being electrically connected to a ground layer of the host circuit board, the board level shield including a shield opening at the top, the shield opening being bounded by the shield walls, the board level shield including shield fingers extending from the shield walls into the shield opening; and a thermal bridge received in the shield opening, the thermal bridge having bridge walls extending between an upper surface and a lower surface, the upper surface located exterior of the shield chamber and the lower surface located interior of the shield chamber, the lower surface having a lower thermal interface thermally coupled to the component interface of the electrical component to dissipate heat from the electrical component, wherein the shield fingers engage the bridge walls of the thermal bridge at separable mating interfaces to electrically connect the shield fingers to the thermal bridge.

20. The electrical assembly of claim 19, further comprising a heat transfer device coupled to the upper surface of the thermal bridge, the thermal bridge dissipating heat from the electrical component to the thermal bridge.

* * * * *